United States Patent
Chen et al.

(10) Patent No.: US 9,348,185 B2
(45) Date of Patent: May 24, 2016

(54) PIXEL STRUCTURE AND MANUFACTURING METHOD THEREOF

(75) Inventors: Chien-Han Chen, Tainan (TW);
Chih-Cheng Wang, Tainan (TW);
Shih-Fang Chen, Hsinchu (TW)

(73) Assignee: E INK HOLDINGS INC., Hsinchu (TW)

( * ) Notice: Subject to any disclaimer, the term of this patent is extended or adjusted under 35 U.S.C. 154(b) by 230 days.

(21) Appl. No.: 13/615,689

(22) Filed: Sep. 14, 2012

(65) Prior Publication Data

US 2014/0008655 A1 Jan. 9, 2014

(30) Foreign Application Priority Data

Jul. 3, 2012 (TW) .............................. 101123912 A

(51) Int. Cl.
*G02F 1/1362* (2006.01)
*H01L 27/12* (2006.01)
*G02F 1/167* (2006.01)

(52) U.S. Cl.
CPC ........ *G02F 1/136227* (2013.01); *H01L 27/124* (2013.01); *H01L 27/1248* (2013.01); *G02F 1/167* (2013.01)

(58) Field of Classification Search
None
See application file for complete search history.

(56) References Cited

U.S. PATENT DOCUMENTS

| | | | |
|---|---|---|---|
| 6,218,206 B1 | 4/2001 | Inoue et al. | |
| 6,300,152 B1 | 10/2001 | Kim | |
| 7,544,069 B2 | 6/2009 | Kim | |
| 7,671,956 B2 | 3/2010 | Jeoung et al. | |
| 7,796,228 B2 | 9/2010 | Kim et al. | |
| 7,852,443 B2 | 12/2010 | Tsuchimichi | |
| 7,876,041 B2 | 1/2011 | Kim et al. | |
| 2005/0127367 A1* | 6/2005 | Huh et al. | 257/72 |
| 2006/0078671 A1* | 4/2006 | Lee et al. | 427/66 |
| 2006/0108917 A1 | 5/2006 | Chung | |
| 2007/0132024 A1* | 6/2007 | Huh et al. | 257/347 |
| 2007/0152210 A1 | 7/2007 | Han et al. | |
| 2008/0278666 A1 | 11/2008 | Tsuchimichi | |
| 2010/0038642 A1 | 2/2010 | Choi et al. | |
| 2010/0051911 A1 | 3/2010 | Cho et al. | |
| 2010/0255620 A1 | 10/2010 | Huh et al. | |
| 2011/0101853 A1 | 5/2011 | Lee et al. | |
| 2011/0140117 A1 | 6/2011 | Lee et al. | |

OTHER PUBLICATIONS

"Office Action of China Counterpart Application," issued on Jun. 19, 2015, p. 1-p. 6.

* cited by examiner

*Primary Examiner* — Whitney T Moore
*Assistant Examiner* — Scott R Wilson
(74) *Attorney, Agent, or Firm* — Jianq Chyun IP Office

(57) ABSTRACT

A pixel structure and a manufacturing method of the pixel structure are provided. The pixel structure includes a substrate, a transistor, a planarizing layer, a plurality of contact windows, and a pixel electrode layer. The transistor is disposed on the substrate and includes a gate, a source, and a drain. The planarizing layer is disposed on the gate, the source, and a portion of the drain. The contact windows penetrate the planarizing layer and expose another portion of the drain. The pixel electrode layer is disposed on the planarizing layer, on the another portion of the drain, and in the contact windows and is electrically connected to the drain.

12 Claims, 7 Drawing Sheets

PIXEL STRUCTURE AND MANUFACTURING METHOD THEREOF

CROSS-REFERENCE TO RELATED APPLICATION

This application claims the priority benefit of Taiwan application serial no. 101123912, filed on Jul. 3, 2012. The entirety of the above-mentioned patent application is hereby incorporated by reference herein and made a part of this specification.

BACKGROUND OF THE INVENTION

1. Field of Invention

The invention relates to a pixel structure and a manufacturing method thereof, and particularly to a pixel structure having a plurality of contact windows and a manufacturing method of the pixel structure.

2. Background of Invention

During a manufacturing process of a pixel structure, a contact window may be formed through an insulation layer having an isolation function, so as to connect an upper conductive layer and a lower conductive layer. For instance, in a pixel structure, a contact window may be formed on an insulated planarizing layer to expose a portion of a drain, such that a pixel electrode may be electrically connected to the portion of the drain.

In a manufacturing process of a conventional pixel structure, after the contact window is formed, surface plasma treatment may be performed on a planarizing layer of the pixel structure, and the planarizing layer is covered by a pixel electrode, so as to enhance adhesion between the planarizing layer and the pixel electrode covering the planarizing layer. However, said process requires an additional manufacturing step and may result in loss of yield or reduction of productivity. Hence, the way to improve the manufacturing process of the conventional pixel structure and strengthen the conventional pixel structure for ensuring favorable adhesion between the pixel electrode and the planarizing layer of the pixel structure is one of the issues worth discussing.

SUMMARY OF THE INVENTION

The invention is directed to a pixel structure that may resolve an issue of unfavorable adhesion between a pixel electrode and a planarizing layer of the pixel structure.

The invention is directed to a manufacturing method of a pixel structure that may resolve an issue of unfavorable adhesion between a pixel electrode and a planarizing layer of the pixel structure.

In an embodiment of the invention, a pixel structure is provided. The pixel structure includes a substrate, a transistor, a planarizing layer, a plurality of contact windows, and a pixel electrode layer. The transistor is disposed on the substrate and includes a gate, a source, and a drain. The planarizing layer is disposed on the gate, the source, and a portion of the drain. The contact windows penetrate the planarizing layer and expose another portion of the drain. The pixel electrode layer is disposed on the planarizing layer, on the another portion of the drain, and in the contact windows, and the pixel electrode layer is electrically connected to the drain.

In an embodiment of the invention, a manufacturing method of a pixel structure is provided, and the manufacturing method includes following steps. A substrate is provided. A transistor is formed on the substrate, and the transistor includes a gate, a source, and a drain. A planarizing layer is formed on the substrate to cover the transistor. A plurality of contact windows penetrating the planarizing layer are formed, and the contact windows expose a portion of the drain. A pixel electrode layer is formed on the planarizing layer, in the contact windows, and on the portion of the drain.

As provided above, in the pixel structure and the manufacturing method of the pixel structure in the embodiments of the invention, the pixel structure includes the plurality of contact windows, so as to expand the contact area between the drain and the pixel electrode layer of the pixel structure and thereby enhance the adhesion between the planarizing layer and the pixel electrode layer which covers the planarizing layer.

Several exemplary embodiments accompanied with figures are described in detail below to further explain the invention.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the invention.

DETAILED DESCRIPTION OF DISCLOSED EXEMPLARY EMBODIMENTS

Figure 1A:
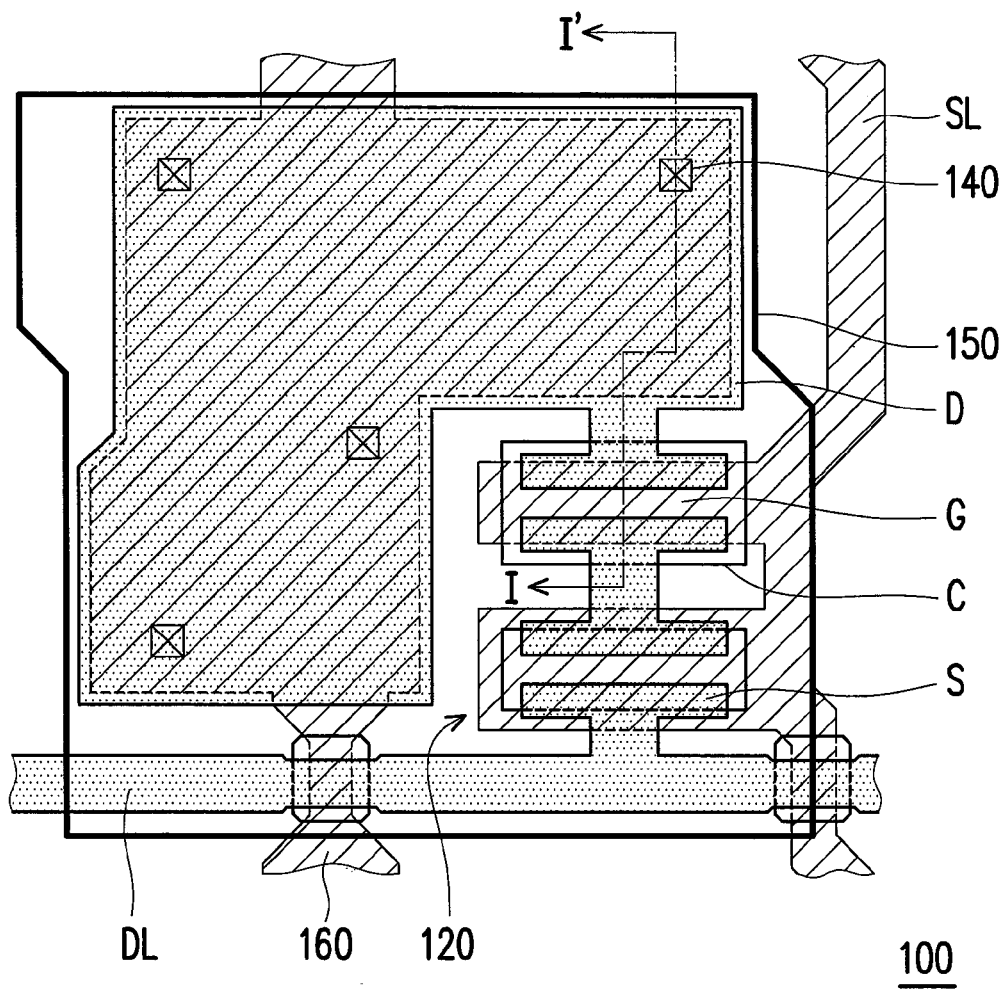
FIG. 1A is a schematic top view illustrating a pixel structure according to an embodiment of the invention.
Figure 1B:
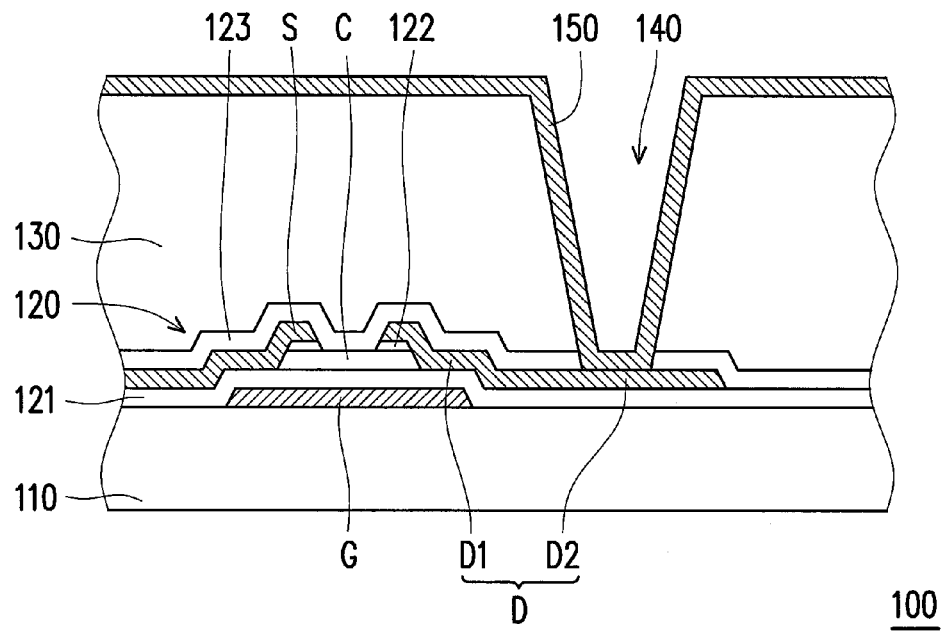
FIG. 1B is a schematic cross-sectional view illustrating the pixel structure depicted in FIG. 1A along line I-I'.

FIG. 1A is a schematic top view illustrating a pixel structure according to an embodiment of the invention, and FIG. 1B is a schematic cross-sectional view illustrating the pixel structure depicted in FIG. 1A along line I-I'. The layer structure of the pixel structure 100 according to this embodiment is described hereinafter with reference to FIG. 1A and FIG. 1B.

The pixel structure 100 includes a substrate 110, a transistor 120, a planarizing layer 130, a plurality of contact windows 140, and a pixel electrode layer 150. The transistor 120 is disposed on the substrate 110. The transistor 120 includes a gate G, a source S, and a drain D. The planarizing layer 130 is disposed on the gate G, the source S, and a first portion D1 of the drain D. The contact windows 140 penetrate the planarizing layer 130 and expose a second portion D2 of the drain D. The pixel electrode layer 150 is disposed on the planarizing layer 130, on the second portion D2 of the drain D, and in the contact windows 140, and the pixel electrode layer 150 is electrically connected to the drain D. In FIG. 1B, one of the contact windows is shown. As a matter of fact, the pixel structure 100 includes a plurality of contact windows 140, as shown in the top view of FIG. 1A. To clearly illustrate the location of each structure in FIG. 1A, the pixel electrode layer 150 is shown as is transparent in FIG. 1A, so as to present the structure covered by the pixel electrode layer 150. However, if the pixel electrode layer 150 is made of metal, the pixel electrode layer 150 is opaque, and therefore the structure below the pixel electrode layer 150 should be hidden and invisible in FIG. 1A.

With reference to FIG. 1B, to be specific, the transistor 120 of the pixel structure 100 further includes a gate insulation layer 121 and a semiconductor layer C. The gate insulation layer 121 is disposed on the gate G, and the semiconductor layer C is disposed on the gate insulation layer 121. The source S is at a distance from the drain D. Besides, the source S is connected to one end of the semiconductor layer C, and the drain D is connected to another end of the semiconductor layer C. The transistor 120 further includes an ohmic contact layer 122 and a protection layer 123. The ohmic contact layer 122 is disposed between the source S and the semiconductor layer C and between the drain D and the semiconductor layer C. The protection layer 123 covers the source S, the drain D, and the semiconductor layer C.

A material of the planarizing layer 130 may be an organic material, for instance, a macromolecule polymer, organic matter containing a photosensitive material, benzocyclobutene (BCB), perfluorocyclobutane (PFCB), fluorinated para-xylene, acrylic resin, color resin, and so on. A material of the pixel electrode layer 150 includes metal or a transparent conductive material. The transparent conductive material is, for instance, indium tin oxide (ITO), indium zinc oxide (IZO), or aluminum zinc oxide (AZO), which should not be construed as a limitation to the invention. The drain D is made of metal. Specifically, the drain D may be made of aluminum (Al), tungsten (W), molybdenum (Mo), tantalum (Ta), chromium (Cr), or an alloy thereof, for instance. Since the pixel structure 100 has a plurality of contact windows 140, there may be a plurality of contact locations between the pixel electrode layer 150 and the drain D. As such, the contact area between the pixel electrode layer 150 and the drain D may be expanded. If the pixel electrode layer 150 is made of metal, the anchor force between the pixel electrode layer 150 and the drain D may be increased by expanding the contact area therebetween because both the pixel electrode layer 150 and the drain D are made of metal. Thereby, favorable adhesion between the planarizing layer 130 and the pixel electrode layer 150 on the planarizing layer 130 may be guaranteed.

As shown in FIG. 1A, parts of the contact windows 140 are located at a corner of the drain D. In the pixel structure 100, an edge portion of each layer is apt to be peeled off from each other; therefore, if parts of the contact windows 140 are located at each corner of the drain D, the pixel electrode layer 150 covering the planarizing layer 130 may be prevented from being peeled off from the corner of the drain D.

The pixel structure 100, as shown in FIG. 1A, may further include a common electrode 160, a data line DL, and a scan line SL. The semiconductor layer C between the data line DL and the common electrode 160 is able to reduce the coupling effect between two metal layers, which should however not be construed as a limitation to the invention. The designer may, based on actual application requirements, selectively decide whether to additionally form the semiconductor layer C between two metal layers.

Figure 1C:
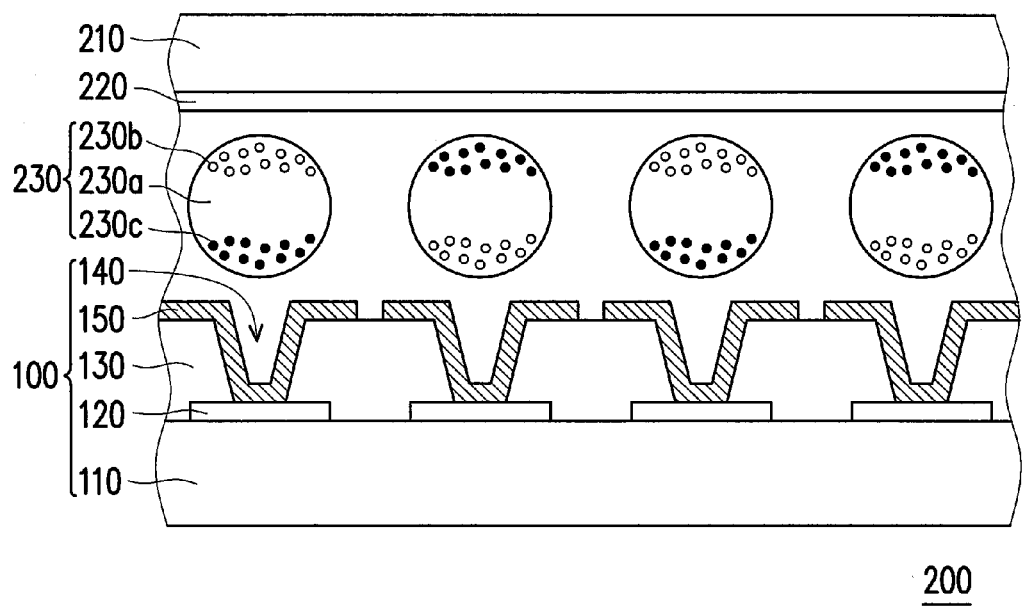
FIG. 1C is a schematic cross-sectional view illustrating an electrophoretic display apparatus in which the pixel structure described in an embodiment of the invention is applied.

The pixel structure 100 described in the present embodiment may be applied to a display apparatus, e.g., an electrophoretic display apparatus. FIG. 1C is a schematic cross-sectional view illustrating an electrophoretic display apparatus in which the pixel structure described in an embodiment of the invention is applied. With reference to FIG. 1C, the electrophoretic display apparatus 200 includes a transparent substrate 210, a transparent electrode layer 220, microcapsules 230, and the pixel structure 100 described in the present embodiment. The transparent substrate 210 is disposed on the pixel structure 100, and the transparent electrode layer 220 is disposed under the transparent substrate 210.

Here, a material of the transparent electrode layer 220 includes ITO, IZO, or AZO, which should not be construed as a limitation to the invention.

The microcapsules 230 are located between the transparent electrode layer 220 and the pixel structure 100 and serves as a display medium. Each of the microcapsules 230 includes electrophoretic liquid 230a, a plurality of black charged particles 230c, and a plurality of white charged particles 230b, and the black charged particles 230c and the white charged particles 230b are distributed in the electrophoretic liquid 230a. By applying the direct voltage or the alternating voltage, the black charged particles 230c and the white charged particles 230b may be driven to move. For instance, the black charged particles 230c carry negative charges, and the white charged particles 230b carry positive charges. When the voltage of the pixel electrode layer 150 is higher than that of the transparent electrode layer 220, the black charged particles 230c and the white charged particles 230b may be controlled, such that the black charged particles 230c may be closer to the pixel electrode layer 150 in comparison with the white charged particles 230b. On the contrary, when the voltage of the pixel electrode layer 150 is lower than that of the transparent electrode layer 220, the white charged particles 230b may be closer to the pixel electrode layer 150 in comparison with the black charged particles 230c.

In the electrophoretic display apparatus 200, through the control of the movement of the white charged particles 230b and the black charged particles 230c, each pixel structure 100 is able to respectively display black, white, or gray at different scales. Besides, the material of the transparent substrate 210 and the substrate 110 may be a flexible material, e.g., plastic. The electrophoretic display apparatus 200 may be in form of an e-paper or an e-book.

The charged particles in the microcapsules 230 are not limited to be black and white. In another embodiment of the invention, the electrophoretic liquid 230a and the charged particles may have other colors, e.g., red, green, or blue, such that the electrophoretic display apparatus 200 may achieve a full-color effect, which should not be construed as a limitation to the invention. Certainly, the color filter technology may also be applied to the electrophoretic display apparatus 200, while the invention is not limited thereto.

The structure of each film layer in the pixel structure 100 and the application thereof are already described according to the present embodiment, and the manufacturing process of the pixel structure 100 described in the present embodiment is introduced hereinafter. FIG. 2A through FIG. 2J are schematic cross-sectional views illustrating a manufacturing process of the pixel structure depicted in FIG. 1B. The manufacturing process of the pixel structure 100 mainly includes following steps. First, a substrate 110 is provided. A transistor 120 is formed on the substrate 110, and the transistor 120 includes a gate G, a source S, and a drain D. A planarizing layer 130 is formed on the substrate 110 to cover the transistor 120. A plurality of contact windows 140 penetrating the planarizing layer 130 are formed, and the contact windows 140 expose a second portion D2 of the drain D. A pixel electrode layer 150 is formed on the planarizing layer 130, in the contact windows 140, and on the second portion D2 of the drain D. The detailed manufacturing process of the pixel structure 100 is elaborated below with reference to FIG. 2A through FIG. 2J.

Figure 2A:
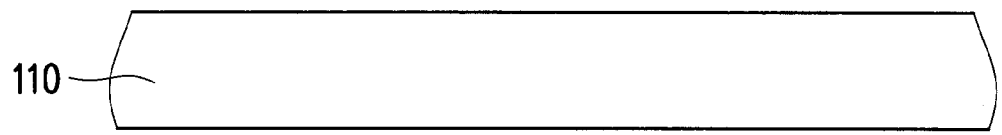
FIG. 2A through FIG. 2J are schematic cross-sectional views illustrating a manufacturing process of the pixel structure depicted in FIG. 1B.
Figure 2B:
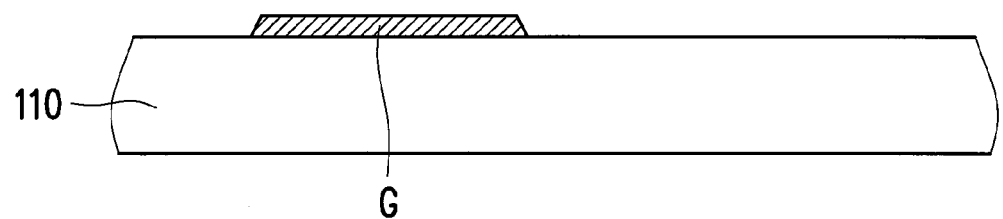

As shown in FIG. 2A, a substrate 110 is provided. A material of the substrate 110 includes glass, plastic, or any other transparent material. Next, as indicated in FIG. 2B, a gate G is formed on the substrate 110, and the gate G may be made of metal. The gate G may be applied to control the transistor 120 to be switched on or switched off.

Figure 2C:
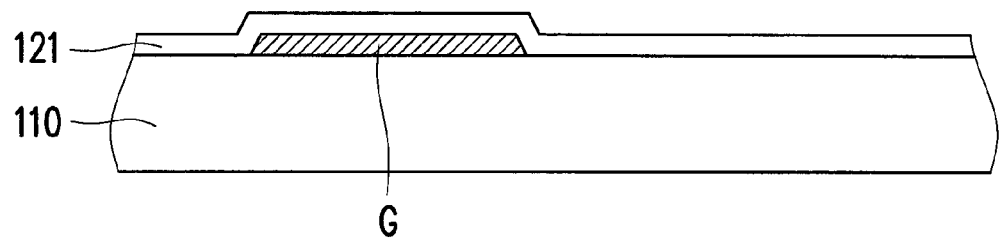

In the steps shown in FIG. 2C, a gate insulation layer 121 is formed above the gate G, and the gate insulation layer 121 may be made of an inorganic material (e.g., silicon oxide, silicon nitride, or silicon oxynitride), an organic material, or a stacked layer containing insulation materials.

Figure 2D:
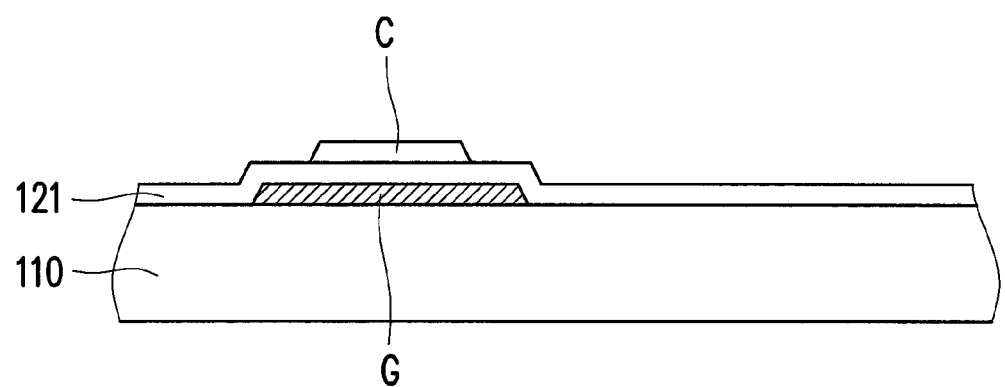

With reference to FIG. 2D, after the gate insulation layer 121 is formed, a semiconductor layer C is formed on the gate insulation layer 121, and the semiconductor layer C may be made of amorphous silicon, which should not be construed as a limitation to the invention. The semiconductor layer C may provide an carrier channel that allows charges to flow through. In the step of forming the gate insulation layer 121 between the gate G and the semiconductor layer C, the gate G may be electrically insulated from the semiconductor layer C by the gate insulation layer 121.

Figure 2E:
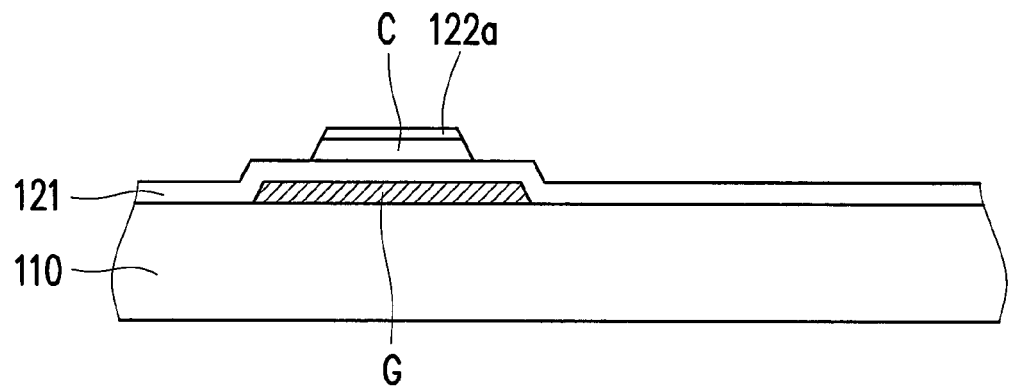
Figure 2F:
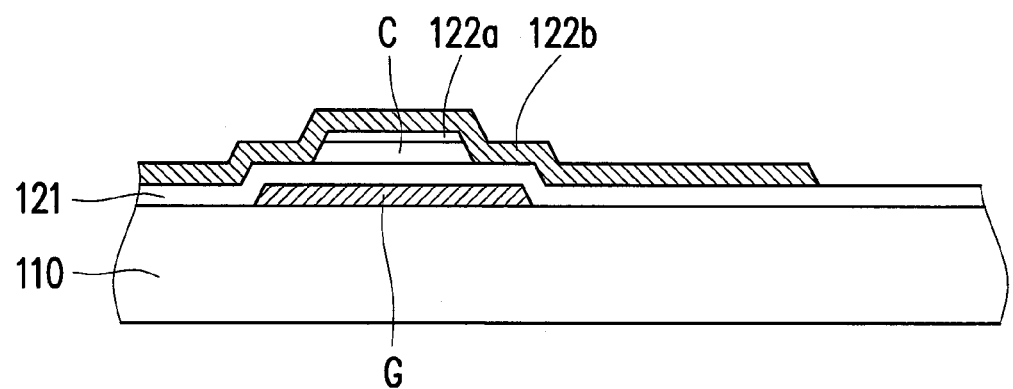

As shown in FIG. 2E, a doped material layer 122a is formed on the semiconductor layer C, and the doped material layer 122a may contain the p-type dopant or the n-type dopant according to the type of the semiconductor layer C. After that, as shown in FIG. 2F, a metal material layer 122b is formed to cover the doped material layer 122a, the semiconductor layer C, and the gate insulation layer 121.

Figure 2G:
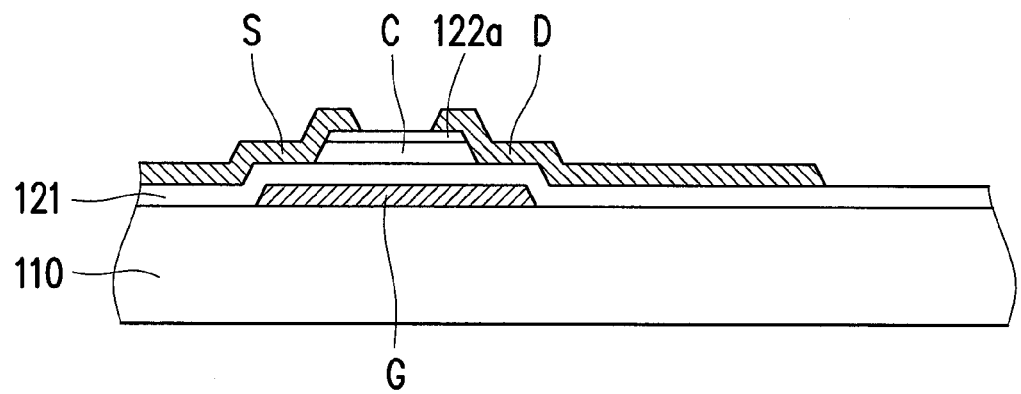
Figure 2H:
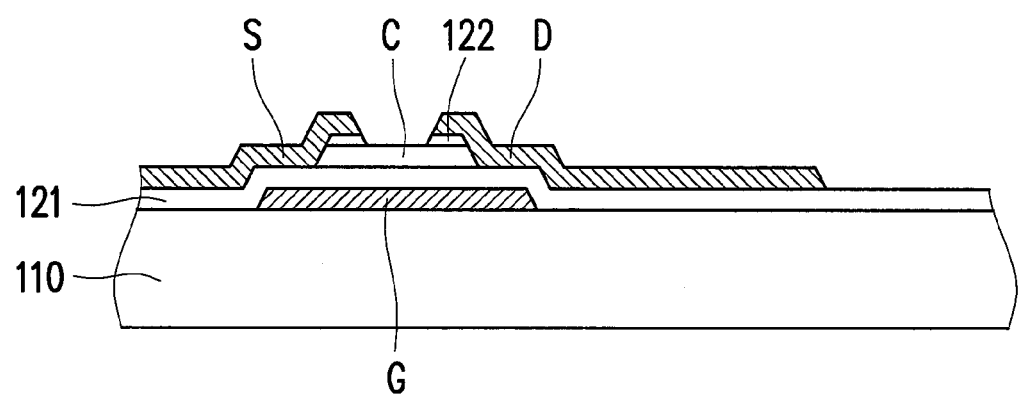

In FIG. 2G, a wet etching process may be performed to etch the metal material layer 122b, so as to form a source S and a drain D. The source S and the drain D may be electrically connected to the underlying semiconductor layer C. With reference to FIG. 2H, a dry etching process is performed to etch the doped material layer 122a, so as to form an ohmic contact layer 122. Here, the ohmic contact layer 122 may reduce contact resistance between the source S, the drain D, and the semiconductor layer C.

Figure 2I:
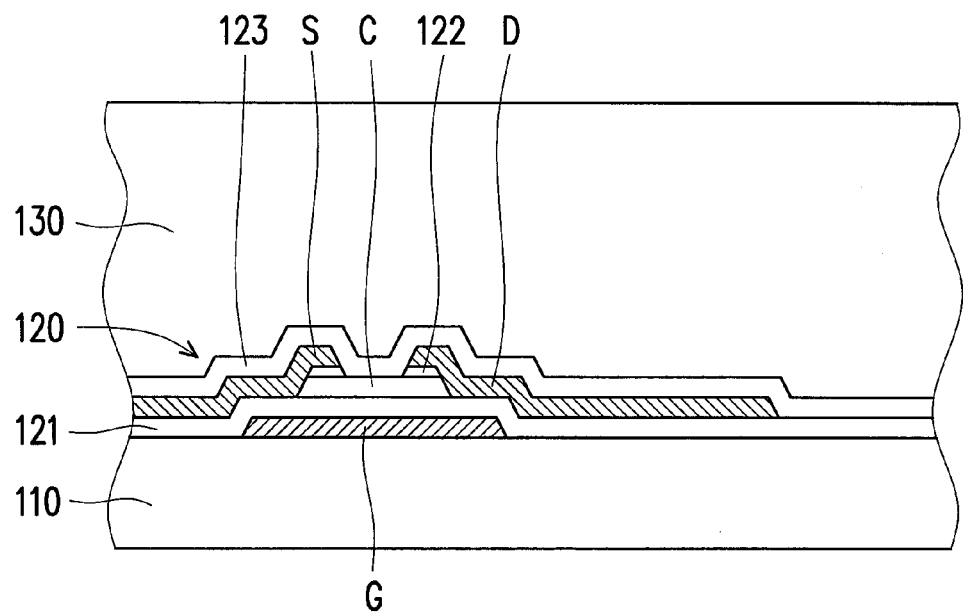

In steps shown in FIG. 2I, a protection layer 123 is formed to cover the source S, the drain D, and the semiconductor layer C. The protection layer 123 may isolate moisture from the source S and the drain D, so as to protect the metal structure. In the present embodiment, a material of the protection layer 123 is, for instance, silicon oxide, whereas the invention is not limited thereto. A planarizing layer 130 is then formed on the protection layer 123, and the planarizing layer 130 may be made of an organic material.

Figure 2J:
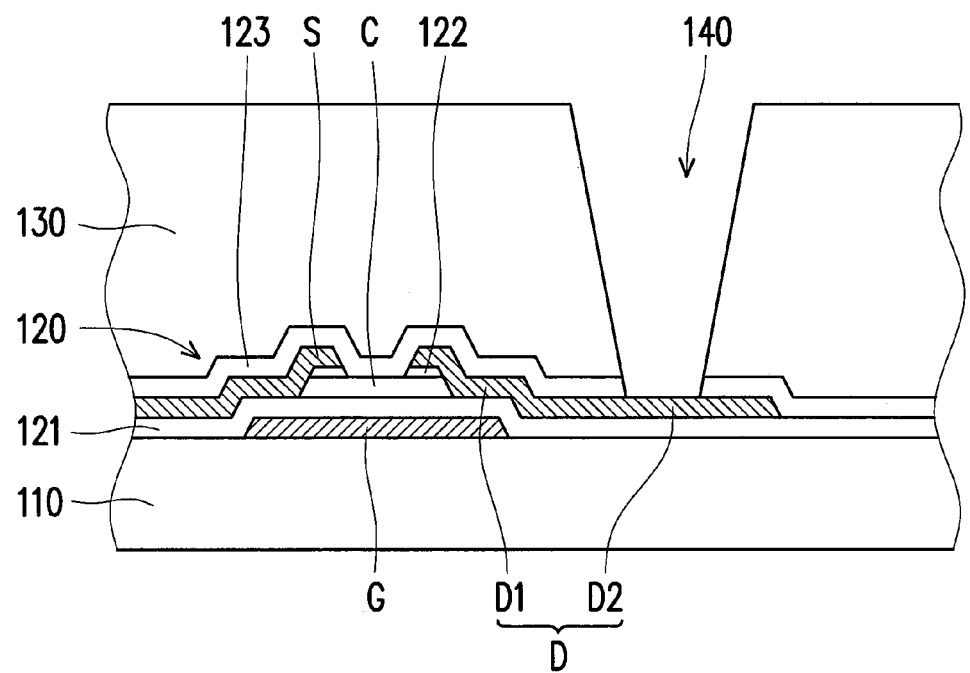

With reference to FIG. 2J, a plurality of contact windows 140 are formed at the same time, and the contact windows 140 expose a second portion D2 of the drain D. FIG. 2J merely exemplarily illustrates one of the contact windows 140. With reference to FIG. 1A, in the step of forming the contact windows 140, as shown in FIG. 2J, the contact windows 140 may be located at each corner of the drain D. As described above, the arrangement of the contact windows 140 at the corners of the drain may avoid the pixel electrode layer 150 that covers the planarizing layer 130 from being peeled off from the corners.

With reference to FIG. 1B, the pixel electrode layer 150 is formed on the planarizing layer 130, in the contact windows 140, and on the second portion D2 of the drain D. A material of the pixel electrode layer 150 includes metal or a transparent conductive material. The transparent conductive material is, for instance, ITO, IZO, or AZO, which should not be construed as a limitation to the invention. Due to the contact windows 140 formed in the previous step, there may be a plurality of contact locations between the pixel electrode layer 150 and the drain D. As such, the contact area between the pixel electrode layer 150 and the drain D may be expanded.

According to the present embodiment, before the pixel electrode layer 150 is formed on the planarizing layer 130, in the contact windows 140, and on the second portion D2 of the drain D, it is likely not to apply the surface plasma treatment technique onto a surface of the planarizing layer 130 which enhances the adhesion between the pixel electrode layer 150 and the planarizing layer 130. In the manufacturing process of the pixel structure 100, the plurality of contact windows 140 are formed to increase the anchor force between the metallic pixel electrode layer 150 and the metal drain D and ensure the favorable adhesion between the pixel electrode layer 150 and the planarizing layer 130. As a result, the manufacturing process may be simplified, and the yield of the manufacturing process may be ameliorated.

To sum up, in the pixel structure and the manufacturing method of the pixel structure according to the embodiments of the invention, the pixel structure includes the plurality of contact windows, so as to expand the contact area between the drain and the pixel electrode layer of the pixel structure and thereby enhance the adhesion between the planarizing layer and the pixel electrode layer covering the planarizing layer. Moreover, the step of performing the surface plasma treatment on the planarizing layer may be omitted in the manufacturing process according to the embodiments of the invention, so as to simplify the manufacturing process.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A pixel structure comprising:
   a substrate;
   a transistor disposed on the substrate, the transistor comprising a gate, a source, and a drain;
   a planarizing layer disposed on the gate, the source, and a portion of the drain;
   a plurality of contact windows located within an area of the drain, the plurality of contact windows penetrating the planarizing layer and exposing another portion of the drain; and
   a pixel electrode layer disposed on the planarizing layer, in the contact windows, and on the another portion of the drain, the pixel electrode layer being electrically connected to the drain, wherein at least two of the contact windows are located adjacent to at least one pair of maximally distant opposite corners of the pixel electrode layer, respectively.

2. The pixel structure as recited in claim 1, wherein a material of the pixel electrode layer comprises metal or a transparent conductive material.

3. The pixel structure as recited in claim 1, wherein a material of the planarizing layer comprises an organic material.

4. The pixel structure as recited in claim 1, wherein at least part of the contact windows is located at a corner of the drain.

5. The pixel structure as recited in claim 1, wherein the gate is disposed on the substrate, and the transistor further comprises:
   an insulation layer disposed on the gate; and
   a semiconductor layer disposed on the insulation layer, wherein the source is connected to one end of the semiconductor layer, and the drain is connected to another end of the semiconductor layer.

6. The pixel structure as recited in claim 1, wherein a material of the drain is metal.

7. A manufacturing method of a pixel structure, comprising:
  providing a substrate;
  forming a transistor on the substrate, the transistor comprising a gate, a source, and a drain;
  forming a planarizing layer on the substrate to cover the transistor;
  forming a plurality of contact windows located within an area of the drain, the plurality of contact windows penetrating the planarizing layer and exposing a portion of the drain; and
  forming a pixel electrode layer on the planarizing layer, in the contact windows, and on the portion of the drain, wherein at least two of the contact windows are located adjacent to at least one pair of maximally distant opposite corners of the pixel electrode layer, respectively.

8. The manufacturing method as recited in claim 7, wherein forming the transistor on the substrate comprise:
  forming the gate on the substrate;
  forming an insulation layer on the gate;
  forming a semiconductor layer on the insulation layer; and
  forming the source and the drain at two opposite ends of the semiconductor layer.

9. The manufacturing method as recited in claim 7, wherein forming the contact windows penetrating the planarizing layer comprises placing at least part of the contact windows at a corner of the drain.

10. The manufacturing method as recited in claim 7, wherein a material of the pixel electrode layer comprises metal or a transparent conductive material.

11. The manufacturing method as recited in claim 7, wherein a material of the planarizing layer comprises an organic material.

12. The manufacturing method as recited in claim 7, wherein a material of the drain is metal.

* * * * *